(12) United States Patent
Leobandung

(10) Patent No.: US 11,088,264 B2
(45) Date of Patent: *Aug. 10, 2021

(54) SELF-ALIGNED CHANNEL-ONLY SEMICONDUCTOR-ON-INSULATOR FIELD EFFECT TRANSISTOR

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/847,380

(22) Filed: Dec. 19, 2017

(65) Prior Publication Data

US 2018/0108758 A1    Apr. 19, 2018

Related U.S. Application Data

(63) Continuation of application No. 14/736,639, filed on Jun. 11, 2015, now Pat. No. 9,935,178.

(51) Int. Cl.
*H01L 29/66* (2006.01)
*H01L 29/78* (2006.01)

(52) U.S. Cl.
CPC ...... *H01L 29/66795* (2013.01); *H01L 29/785* (2013.01); *H01L 29/7848* (2013.01)

(58) Field of Classification Search
CPC ............ H01L 29/66795; H01L 29/785; H01L 29/7848
See application file for complete search history.

(56) References Cited

U.S. PATENT DOCUMENTS

| 5,792,679 A * | 8/1998 | Nakato ................ B82Y 10/00 438/162 |
| 6,413,802 B1 * | 7/2002 | Hu ........................ H01L 21/845 438/151 |
| 7,470,576 B2 | 12/2008 | Tang et al. |
| 7,936,000 B2 | 5/2011 | Tang et al. |
| 8,426,273 B2 | 4/2013 | Hanson et al. |
| 8,759,874 B1 | 6/2014 | Loubet et al. |
| 8,766,363 B2 | 7/2014 | Cheng et al. |
| 8,956,942 B2 | 2/2015 | Loubet et al. |

(Continued)

*Primary Examiner* — Dale E Page
*Assistant Examiner* — Quovaunda Jefferson
(74) *Attorney, Agent, or Firm* — Kristofer L. Haggerty

(57) ABSTRACT

In one example, a field effect transistor includes a fin. The fin includes a conducting channel formed from semiconductor-on-insulator and source/drain regions formed on opposite ends of the conducting channel, wherein the source/drain regions are formed from a material other than semiconductor-on-insulator. A gate is wrapped around the conducting channel, between the source/drain regions. In another example, a method for fabricating a field effect transistor includes forming a fin on a wafer. The fin includes a conducting channel formed from semiconductor-on-insulator and source/drain regions formed on opposite ends of the conducting channel, wherein the source/drain regions are formed from a material other than semiconductor-on-insulator. A gate is also formed between the source/drain regions and wraps around the conducting channel.

8 Claims, 9 Drawing Sheets

(56) References Cited

U.S. PATENT DOCUMENTS

| | | |
|---|---|---|
| 9,935,178 B2* | 4/2018 | Leobandung ......... H01L 29/785 |
| 2005/0035415 A1 | 2/2005 | Yeo et al. |
| 2005/0214993 A1* | 9/2005 | Skotnicki .......... H01L 29/66772 |
| | | 438/176 |
| 2007/0001237 A1 | 1/2007 | King et al. |
| 2010/0109084 A1 | 5/2010 | Chung |
| 2011/0210393 A1 | 9/2011 | Chen et al. |
| 2014/0124863 A1 | 5/2014 | Cheng et al. |
| 2014/0191321 A1 | 7/2014 | Cheng et al. |
| 2014/0353767 A1 | 12/2014 | Liu et al. |
| 2015/0014773 A1 | 1/2015 | Cheng et al. |
| 2015/0053913 A1 | 2/2015 | Cheng et al. |
| 2015/0056781 A1 | 2/2015 | Akarvardar et al. |
| 2015/0060997 A1 | 3/2015 | Basu et al. |
| 2015/0064855 A1 | 3/2015 | Cheng et al. |

* cited by examiner

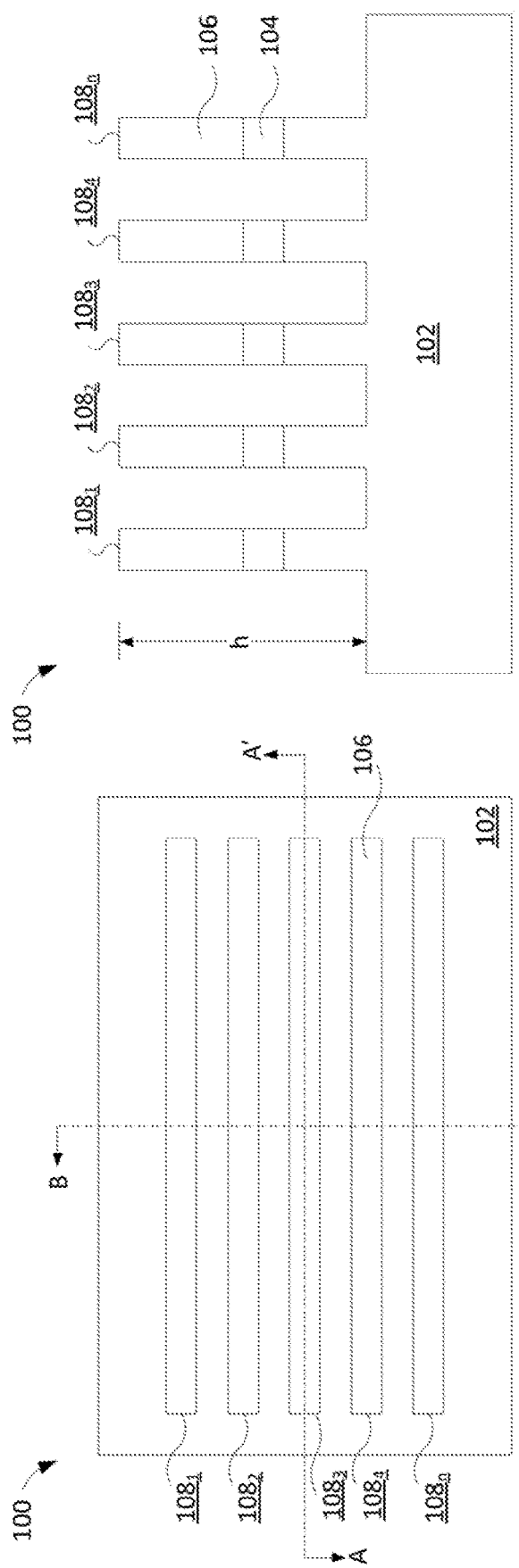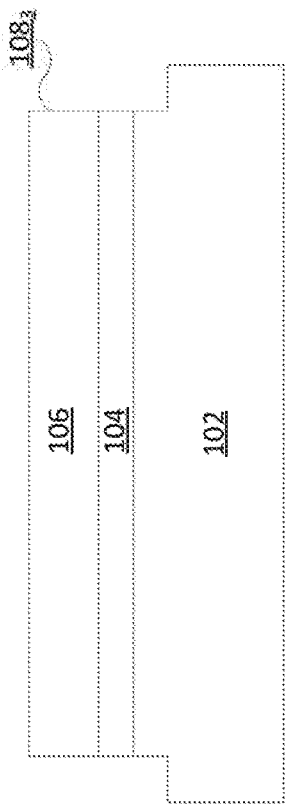

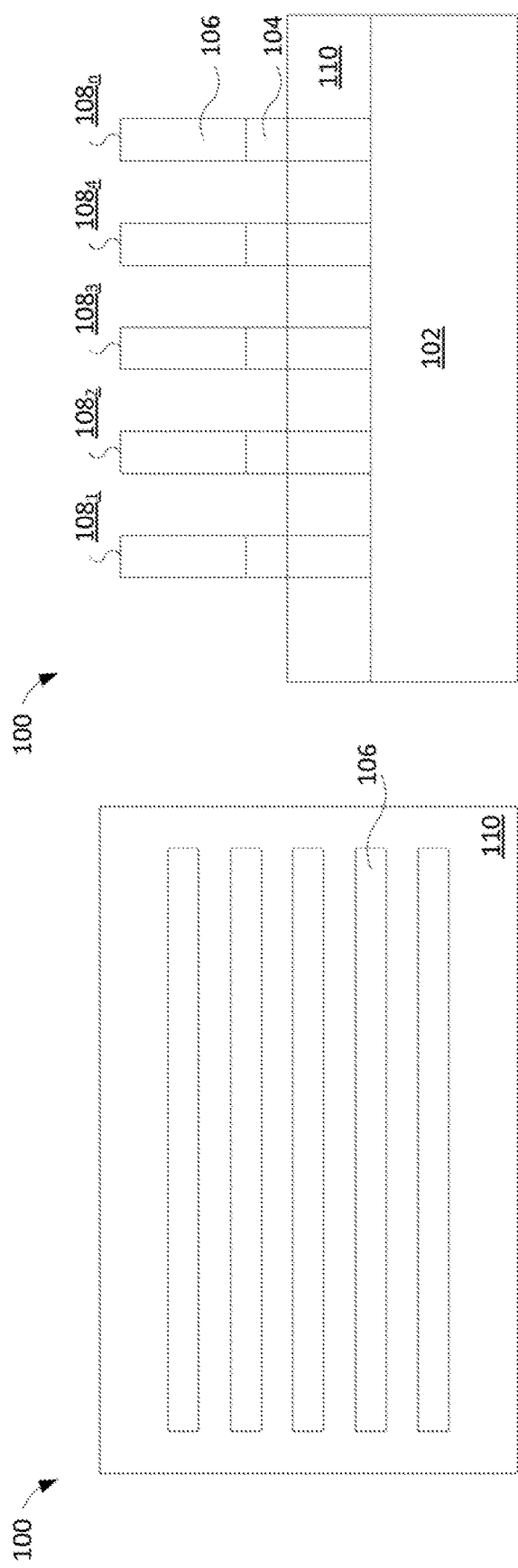
FIG. 2B
FIG. 1B
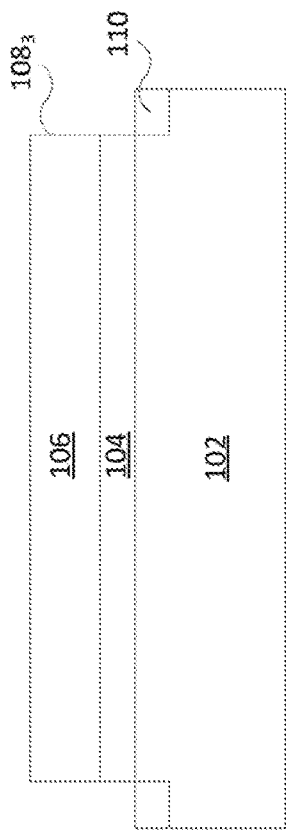
FIG. 3B

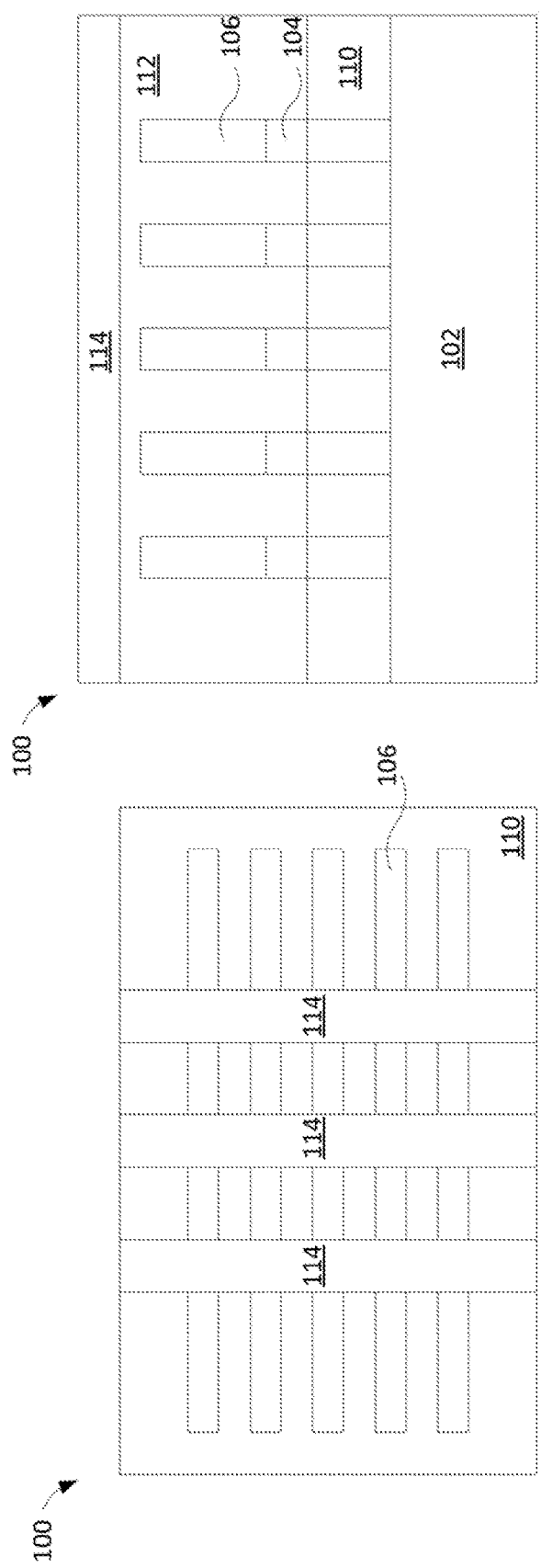
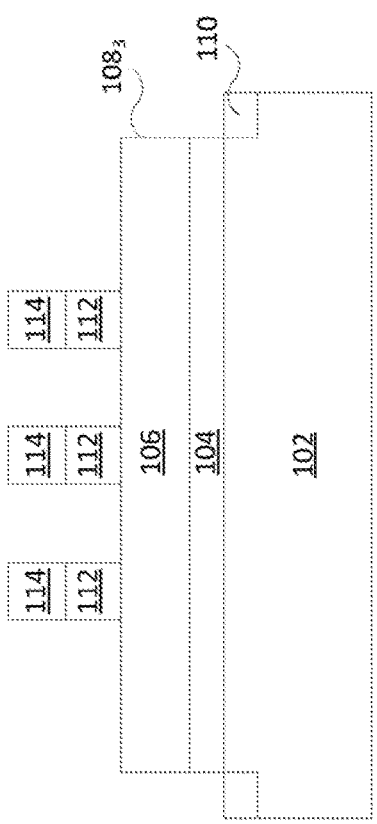
FIG. 1C
FIG. 2C
FIG. 3C

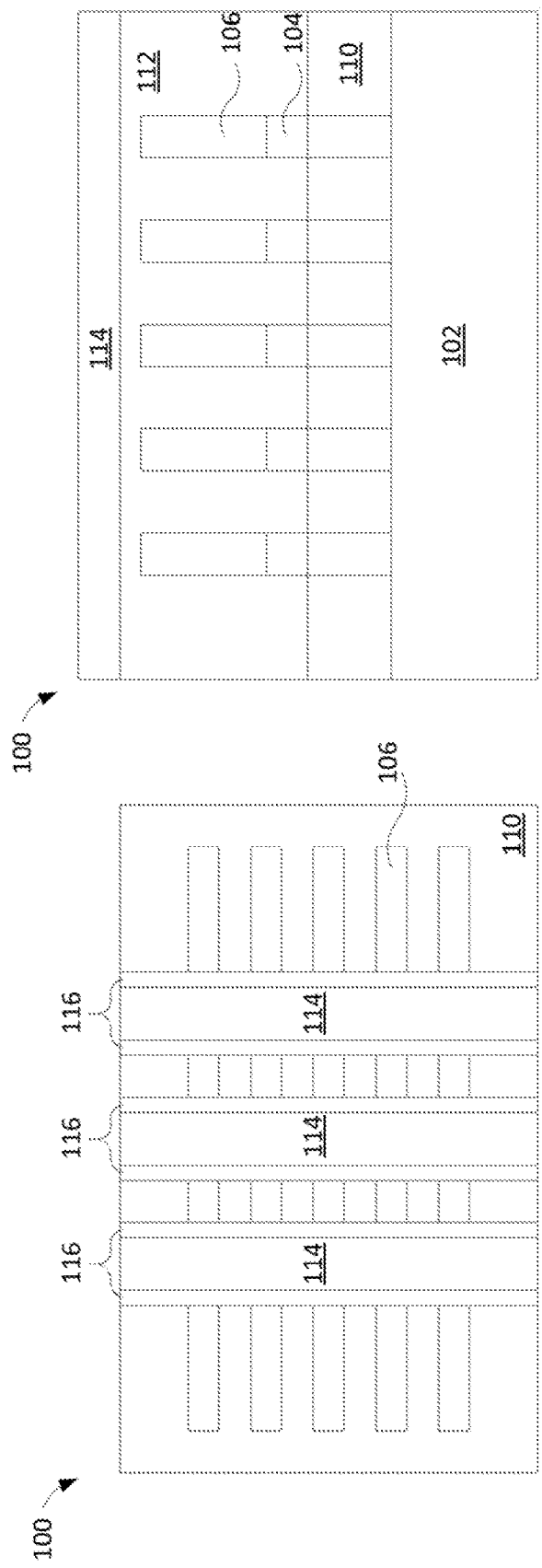
FIG. 1D
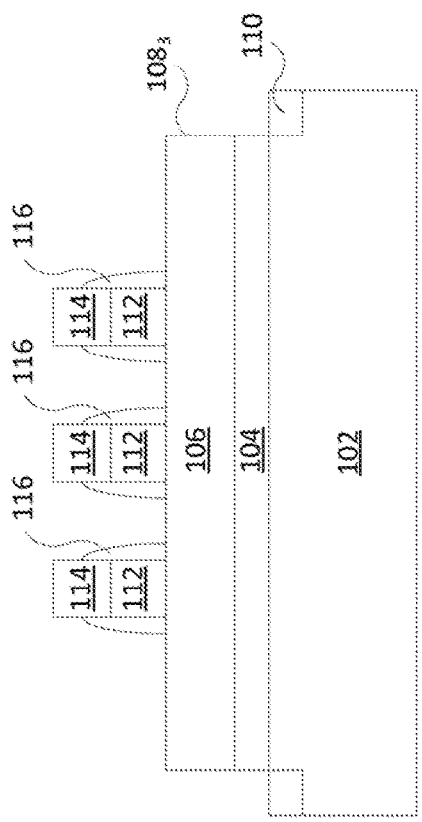
FIG. 2D
FIG. 3D

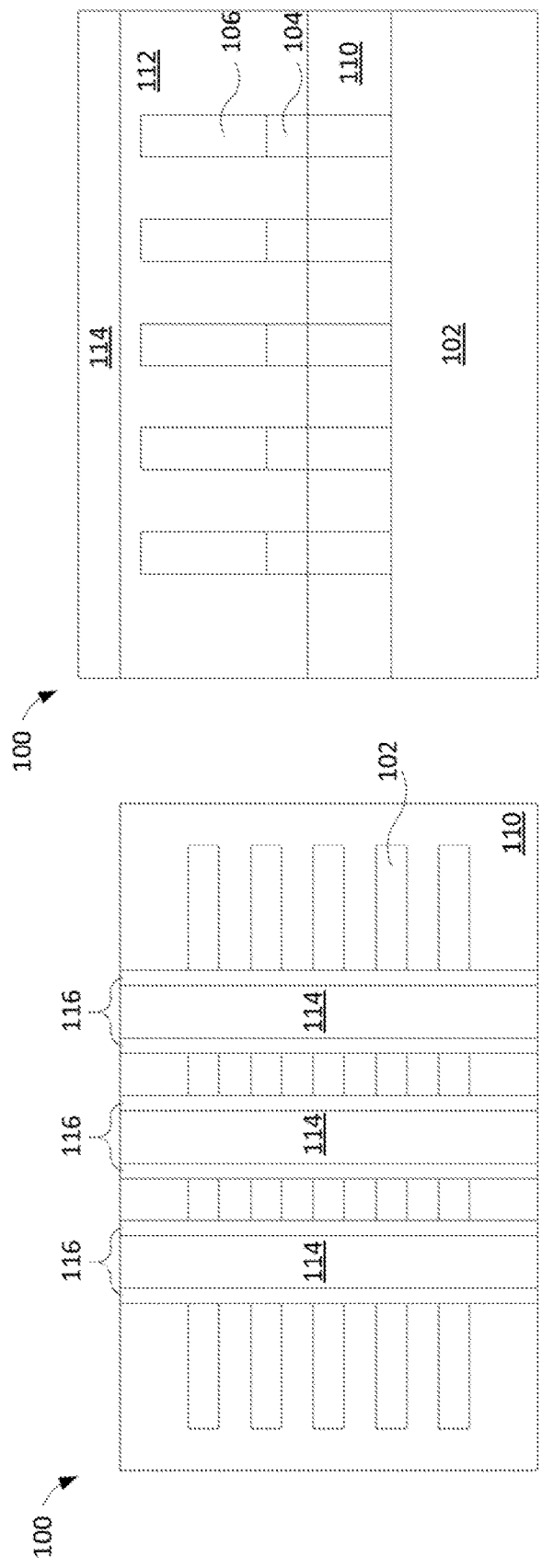
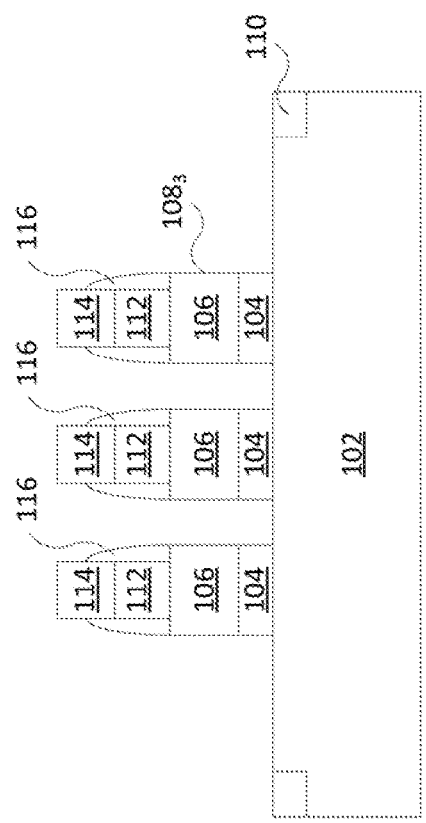

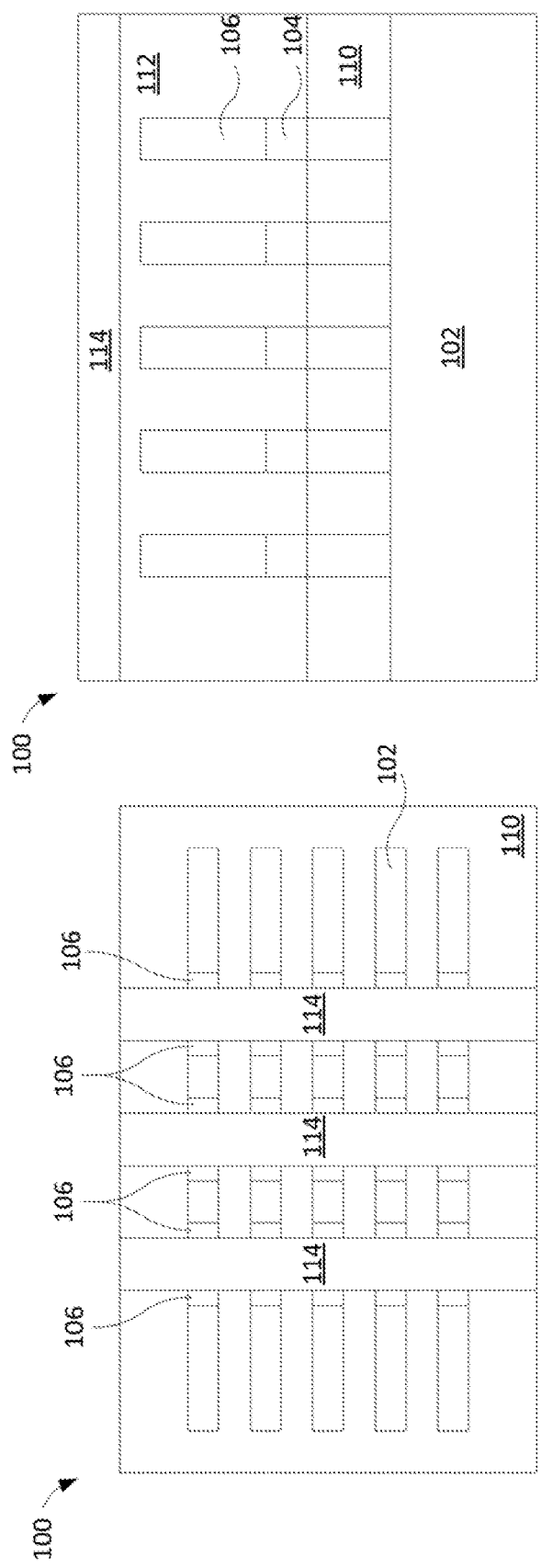
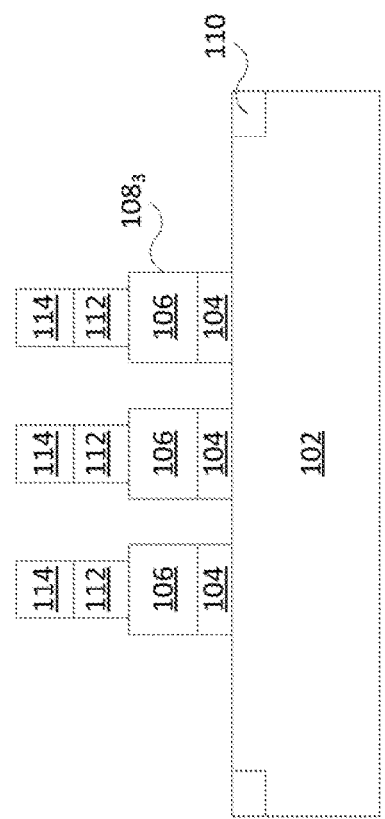
FIG. 1F
FIG. 2F
FIG. 3F

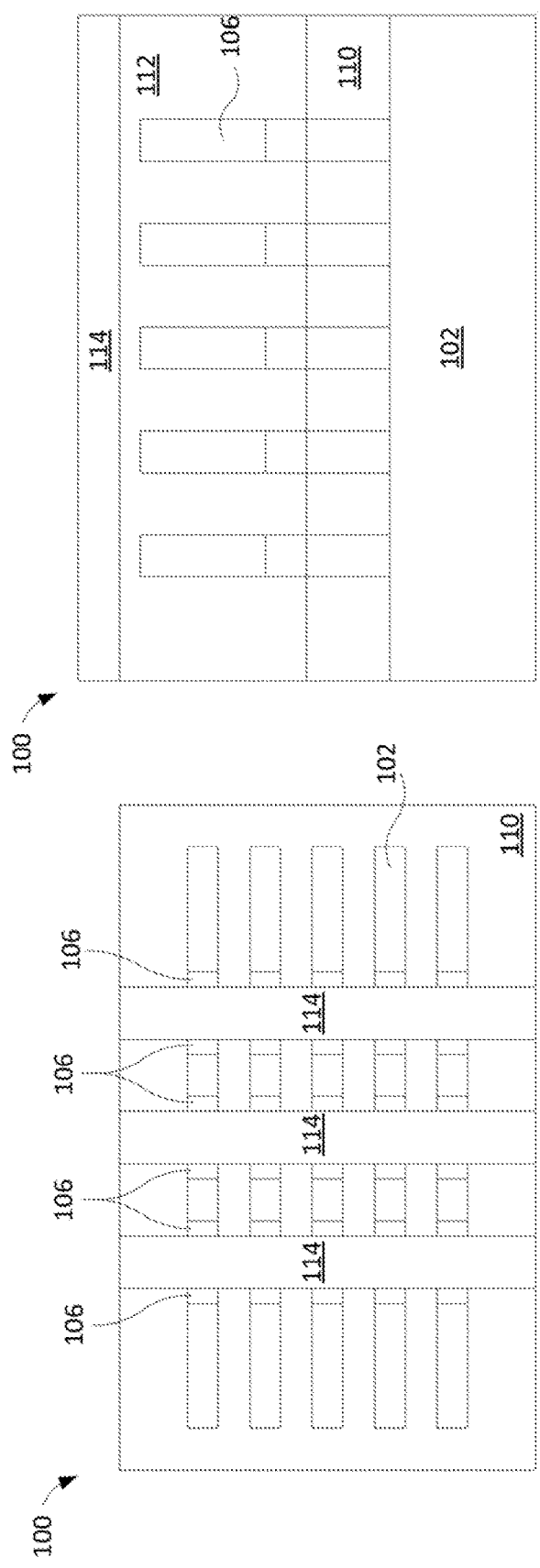
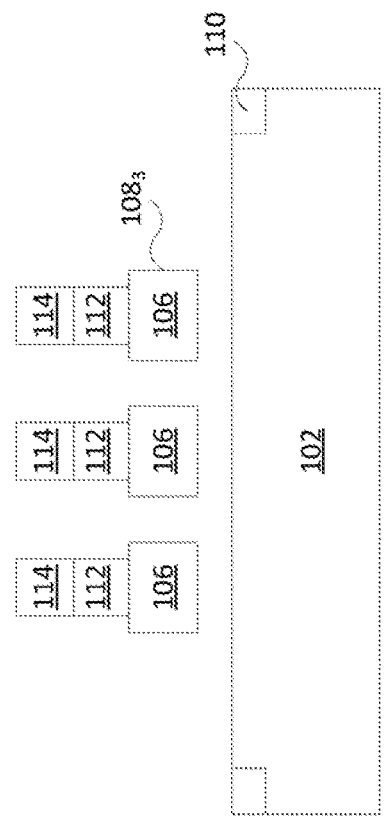
FIG. 1G
FIG. 2G
FIG. 3G

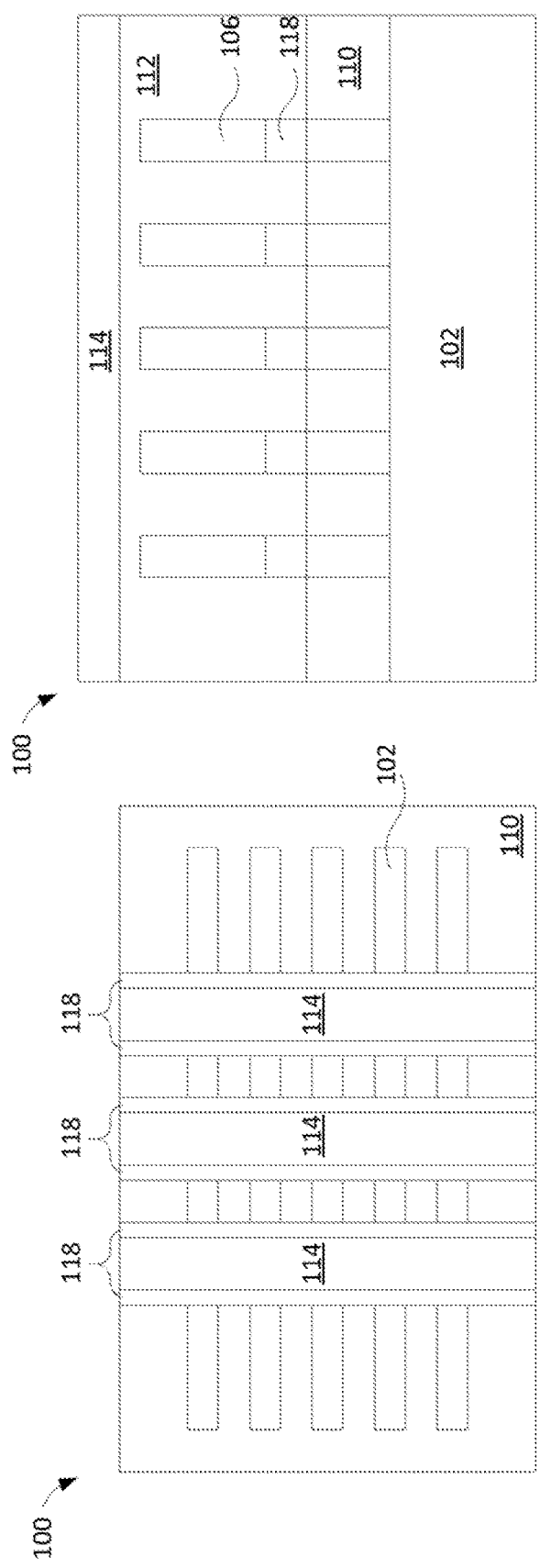
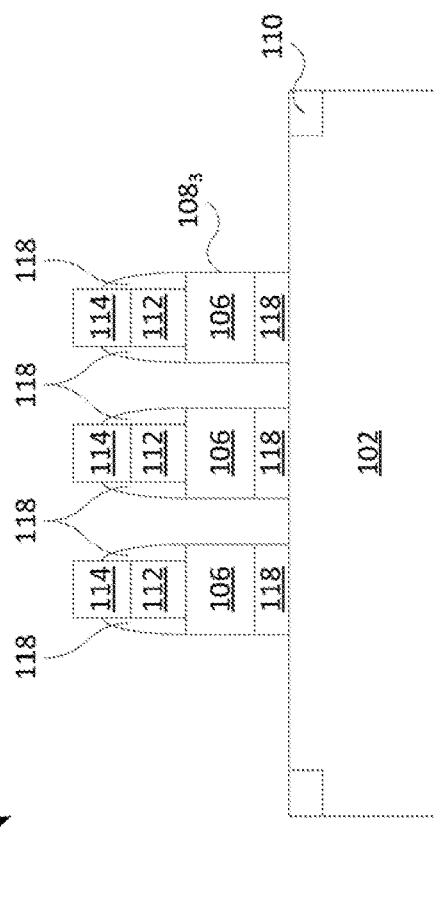
FIG. 1H
FIG. 2H
FIG. 3H

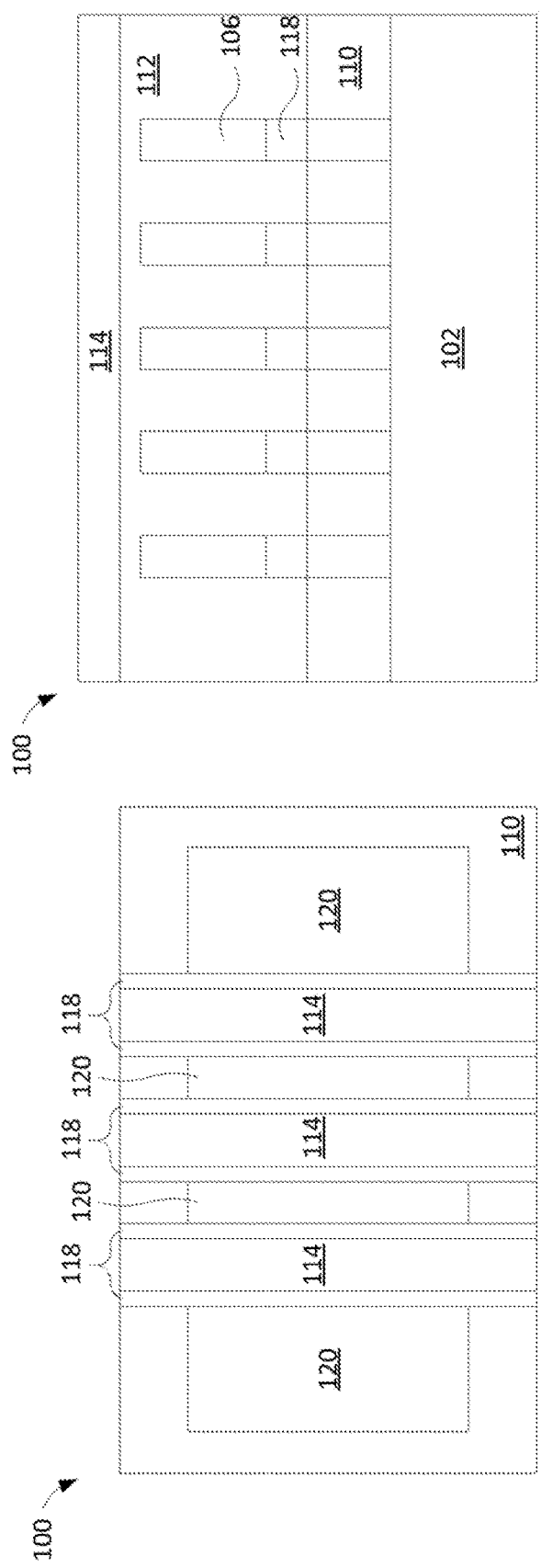
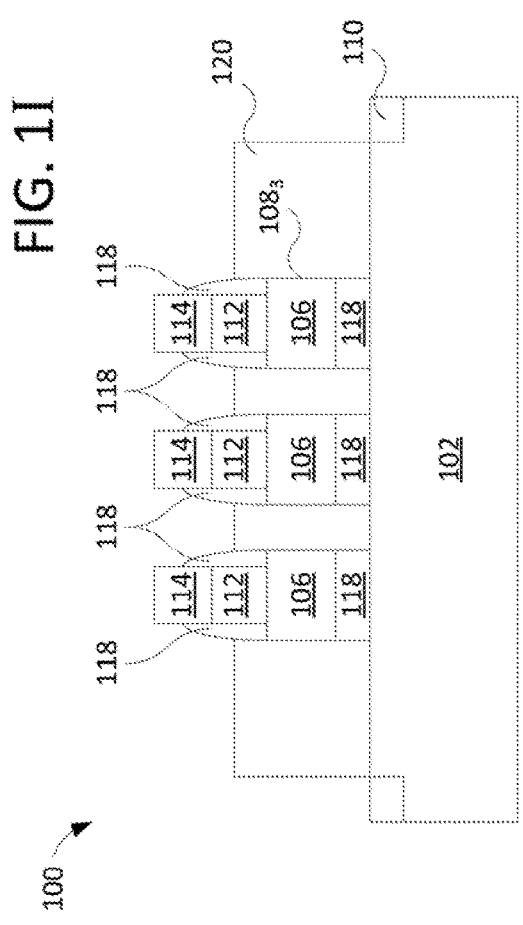
FIG. 1I
FIG. 2I
FIG. 3I

SELF-ALIGNED CHANNEL-ONLY SEMICONDUCTOR-ON-INSULATOR FIELD EFFECT TRANSISTOR

FIELD OF THE DISCLOSURE

The present disclosure relates generally to semiconductor devices and relates more specifically to multiple gate field effect transistors.

BACKGROUND OF THE DISCLOSURE

Multiple gate field effect transistors (FETs) are metal-oxide-semiconductor field effect transistors (MOSFETs) that incorporate more than one gate into a single device. A finFET is a specific type of multiple gate FET in which the conducting channel is wrapped by a thin fin forming the body of the device. The effective channel length of the device in this case is determined by the thickness of the fin (measured from source to drain). The wrap-around structure of the gate provides improved electrical control over the channel, and thus helps mitigate leakage current and other short-channel effects.

SUMMARY OF THE DISCLOSURE

In one example, a field effect transistor includes a fin. The fin includes a conducting channel formed from semiconductor-on-insulator and source/drain regions formed on opposite ends of the conducting channel, wherein the source/drain regions are formed from a material other than semiconductor-on-insulator. A gate is wrapped around the conducting channel, between the source/drain regions.

In another example, a field effect transistor includes a plurality of short conducting channels formed from semiconductor-on-insulator and aligned along a common line that extends in a direction of conductance of the field effect transistor, a plurality of gates, wherein each of the plurality of gates is wrapped around one of the plurality of short conducting channels, and a plurality of source/drain regions formed from a material other than semiconductor-on-insulator, wherein one of the plurality of source/drain regions is positioned between each pair of the plurality of short conducting channels.

In another example, a method for fabricating a field effect transistor includes forming a fin on a wafer. The fin includes a conducting channel formed from semiconductor-on-insulator and source/drain regions formed on opposite ends of the conducting channel, wherein the source/drain regions are formed from a material other than semiconductor-on-insulator. A gate is also formed between the source/drain regions and wraps around the conducting channel.

BRIEF DESCRIPTION OF THE DRAWINGS

The teachings of the present disclosure can be readily understood by considering the following detailed description in conjunction with the accompanying drawings, in which:

FIGS. 1A-1I illustrate top views of a field effect transistor during various stages of the fabrication process;

FIGS. 2A-2I illustrate corresponding cross sectional views of the field effect transistor of FIGS. 1A-1I during the various stages of the fabrication process; and FIGS. 3A-3I illustrate corresponding cross sectional views of the field effect transistor of FIGS. 1A-1I during the various stages of the fabrication process.

To facilitate understanding, identical reference numerals have been used, where possible, to designate identical elements that are common to the Figures.

DETAILED DESCRIPTION

In one example, a self-aligned channel-only semiconductor-on-insulator field effect transistor is disclosed. Conventional processes for fabricating silicon-on-insulator (SOI) channels in field effect transistors (FETs) form both the conducting channel and the source/drain regions from SOI. Although SOI has been shown to provide advantages when used in the short channel regions, it is a less ideal material for the source/drain regions due to lack of stresses that enhance device performance.

Examples of the present disclosure provide a finFET on a bulk silicon wafer that includes semiconductor-on-insulator in the conducting channel portion of the fin(s) only. In one example, source/drain regions, formed from a material other than semiconductor-on-insulator, are included in the fin(s) and formed on both ends of the conducting channel. Thus, the advantages of semiconductor-on-insulator conducting channels are maintained, while avoiding the drawbacks typical of semiconductor-on-insulator source/drain regions. In a further example, the conducting channel is broken into several shorter conducting channels that are aligned along a common line that extends in the direction of conductance. A gate is formed over each shorter conducting channel. Each pair of the shorter conducting channels is separated by a source/drain region. Thus, in this configuration, the source/drain regions may be described as "slotted."

FIGS. 1A-1I, FIGS. 2A-2I, and FIGS. 3A-3I illustrate field effect transistor (FET) 100 during various stages of a fabrication process performed according to examples of the present disclosure. As such, when viewed in sequence, 1A-1I, FIGS. 2A-2I, and FIGS. 3A-3I also serve as a flow diagram for the fabrication process. In particular, FIGS. 1A-1I illustrate top views of the FET 100 during various stages of the fabrication process; FIGS. 2A-2I illustrate corresponding cross sectional views (i.e., taken along sectional line B-B' of FIG. 1A, or along the shorter dimension of the fins) of the FET 100 of FIGS. 1A-1I during the various stages of the fabrication process; and FIGS. 3A-3I illustrate corresponding cross sectional views (i.e., taken along sectional line A-A' of FIG. 1A, or along the longer dimension of the fins) of the FET 100 of FIGS. 1A-1I during the various stages of the fabrication process.

Referring simultaneously to FIG. 1A, FIG. 2A, and FIG. 3A one example of the field effect transistor (FET) 100 begins as a wafer 102, formed, for example, from bulk silicon (Si), a Group III-V material, a Group III-V material on silicon, or other semiconductor materials. A dummy release layer 104, formed, for example, from silicon germanium (SiGe) or another single-crystal material that is different from the material forming the wafer 102, is deposited directly on the wafer 102. A semiconductor layer 106 is deposited directly on the dummy release layer 104. The semiconductor layer 106 may comprise, for example, silicon, germanium, a Group III-V material, or any other type of semiconductor material. The semiconductor layer 106 is then patterned to create a plurality of fins $108_1$-$108_n$ (hereinafter collectively referred to as "fins 108"). Patterning of the semiconductor layer 106 involves etching the semiconductor layer 106, the dummy release layer 104, and a portion of the wafer 102 and may further involve the deposition of additional layers of material, such as hard masks or other sacrificial materials (not shown) that are removed in the process of creating the structure illustrated in FIG. 1A, FIG. 2A, and FIG. 3A. In one embodiment, the fins 108 are patterned to a height, h, of approximately thirty to one hundred nanometers.

As illustrated in FIG. 1B, FIG. 2B, and FIG. 3B, an isolation layer 110 is next deposited directly on the wafer 102. The isolation may comprise, for example, an insulator such as silicon dioxide ($SiO_2$) In one embodiment, the isolation layer 110 fills in the areas of the wafer 102 that were etched during patterning of the fins 108 (e.g., in the step illustrated by FIGS. 1A, 2A, and 3A). It may then be planarized and etched to the level illustrated in FIG. 1B, FIG. 2B, and FIG. 3B.

As illustrated in FIG. 1C, FIG. 2C, and FIG. 3C, a plurality of gate stacks is next formed on the isolation layer 110. The gate stacks wrap around the fins 108. The gate stacks may comprise real (i.e., functional) gates or dummy gates (i.e., a gate-like structure that is fabricated and then removed so as to create a space for a real gate to be formed at a later time). If the gate stacks comprise real gates, then the gate stacks may each include, for example, a gate metal layer 112 and a thin gate dielectric (not shown) deposited directly on the isolation layer 110 and a hard mask layer 114 deposited directly on the gate metal layer 112. Selection of the gate metal material(s) may be dictated by whether the FET 100 is an N-type FET (NFET) or a P-type FET (PFET). Alternatively, if the gate stacks comprise dummy gates, then the gate stacks may each include, for example, an amorphous silicon layer 112 and a thin dummy gate dielectric (not shown) deposited directly on the isolation layer 110 and a hard mask layer 114 deposited directly on the amorphous silicon layer 112.

As illustrated in FIG. 1D, FIG. 2D, and FIG. 3D, a first plurality of spacers 116 is next formed on both sides of each gate stack, along the longer dimension of the gate stacks (or, alternatively, along the shorter dimension of the fins 108). The first plurality of spacers 116 are meant to be disposable (i.e., will be removed in subsequent processing steps) and thus may be formed, for example, from amorphous carbon.

As illustrated in FIG. 1E, FIGS. 2E, and 3E the source/drain regions are next recessed. In particular, the portions of the fins 108 (specifically the portions of the dummy release layer 104 and semiconductor layer 106) residing between the gate stacks are removed, for example by etching down to the wafer 102. Thus, the remaining portions of the dummy release layer 104 and the semiconductor layer 106 are the portions residing within the channel sections of the fins 108.

As illustrated in FIG. 1F, FIG. 2F, and FIG. 3F, the first plurality of spacers 116 is next removed, exposing the ends of the short channels of the fins 108. Between each pair of short channels is a source/drain region.

As illustrated in FIG. 1G, FIG. 2G, and FIG. 3G, dummy release layer 104 is next removed. In one example, a selective etch process, such as an isotropic etch, is used to remove the dummy release layer 104. The etch process may comprise, for instance, a wet etch process or an etch process using hydrogen chloride gas.

As illustrated in FIG. 1H, FIG. 2H, and FIG. 3H, a second plurality of spacers 118 is next formed on both sides of each gate stack, along the longer dimension of the gate stacks (or, alternatively, along the shorter dimension of the fins 108). Thus, the second plurality of spacers 118 is fabricated in the same places previously occupied by the first plurality of spacers 116. In addition, the second plurality of spacers 118 fills in the spaces from which the dummy release layer 104 was removed in FIGS. 1G, 2G, and 3G. In one example, the second plurality of spacers 118 may be formed, for example, from silicon nitride (SiN) or silicon dioxide ($SiO_2$).

As illustrated in FIG. 1I, FIG. 2I, and FIG. 3I, raised source/drain regions 120 are next grown on the wafer 102, over the fins 108 and between the gate stacks. The source/drain regions 120 are "raised" in the sense that they are higher than the semiconductor layer 106 (and, thus, higher than the conducting channel portions of the fins 108). In an alternative example, the source/drain regions 120 are not raised. The materials forming the source/drain regions 120 may be selected based on whether the FET 100 is an NFET or a PFET. In one example, the source/drain regions 120 are grown through a selective epitaxial process.

Thus, in the resultant field effect transistor 100, the gates are wrapped around a plurality of fins 108 whose conducting channel portions are formed from semiconductor-on-insulator (i.e., semiconductor layer 106 on insulator/second plurality of spacers 118). The source/drain regions 120 positioned at the ends of the conducting channels are slotted and contain no semiconductor-on-insulator. Thus, the conducting channels of the fins 108 are formed from a different material than the source/drain regions 120. Thus, the advantages of semiconductor-on-insulator conducting channels are maintained, while avoiding the drawbacks typical of semiconductor-on-insulator source/drain regions.

Although various embodiments which incorporate the teachings of the present invention have been shown and described in detail herein, those skilled in the art can readily devise many other varied embodiments that still incorporate these teachings.

What is claimed is:

1. A method for fabricating a field effect transistor, the method comprising:
    forming a fin on a wafer, wherein the fin comprises:
        a conducting channel formed from semiconductor-on-insulator, wherein the conducting channel is formed by:
            depositing a dummy layer on the wafer;
            depositing a semiconductor layer over the dummy layer;
            patterning the semiconductor layer, the dummy layer, and a portion of the wafer to create the fin;
            removing the dummy layer; and
            replacing the dummy layer with an insulator; and
        source/drain regions formed on opposite ends of the conducting channel, wherein the source/drain regions are formed by:
            forming a first plurality of spacers around the gate stack;
            creating recesses in portions of the semiconductor layer and the dummy layer that extend beyond the first plurality of spacers; and
            growing the source/drain regions in the recesses;
        and wherein the source/drain regions are formed from a material other than semiconductor-on-insulator; and
    forming a gate between the source/drain regions that wraps around the conducting channel, wherein forming the gate comprises:
        depositing an isolation layer on the wafer, subsequent to the patterning, wherein the isolation layer covers the semiconductor layer;
        fabricating a gate stack on the isolation layer;

and wherein the gate comprises:
- a first layer directly in contact with the conducting channel, wherein the first layer is formed from a gate metal; and
- a hard mask deposited on the first layer.

2. The method of claim 1, wherein the insulator is silicon dioxide.

3. The method of claim 1, wherein removing the dummy layer is performed using a selective etch process.

4. The method of claim 1, wherein growing the source/drain regions is performed using a selective epitaxial process.

5. The method of claim 1, wherein replacing the dummy layer comprises:
- removing the first plurality of spacers, subsequent to creating the recesses but prior to removing the dummy layer, to provide access to the dummy layer;
- subsequent to removing the dummy layer, filling spaces from which the dummy layer was removed with the insulator.

6. The method of claim 5, further comprising:
- forming a second plurality of spacers around the gate stack, subsequent to filling the spaces from which the dummy layer was removed.

7. The method of claim 6, wherein the first plurality of spacers is formed from amorphous carbon, and the second plurality of spacers is formed from silicon nitride or silicon dioxide.

8. The method of claim 1, wherein the source/drain regions are raised with respect to the conducting channel.

* * * * *